(12) United States Patent
Cao et al.

(10) Patent No.: US 7,358,100 B2
(45) Date of Patent: Apr. 15, 2008

(54) BOTTOM CONDUCTOR FOR INTEGRATED MRAM

(75) Inventors: Wei Cao, San Jose, CA (US); Chyu-Jiuh Torng, Pleasanton, CA (US); Cheng Horng, San Jose, CA (US); Ruying Tong, Los Gatos, CA (US); Chen-Jung Chien, Sunnyvale, CA (US); Liubo Hong, San Jose, CA (US)

(73) Assignee: Magic Technologies, Inc., Milpitas, CA (US)

( * ) Notice: Subject to any disclaimer, the term of this patent is extended or adjusted under 35 U.S.C. 154(b) by 0 days.

(21) Appl. No.: 11/891,923

(22) Filed: Aug. 14, 2007

(65) Prior Publication Data

US 2007/0281427 A1    Dec. 6, 2007

Related U.S. Application Data

(62) Division of application No. 11/215,276, filed on Aug. 30, 2005, now Pat. No. 7,265,404.

(51) Int. Cl.
*H01L 21/00* (2006.01)

(52) U.S. Cl. ............... 438/3; 257/295; 257/E21.665

(58) Field of Classification Search ............... 438/3; 257/295, E21.665
See application file for complete search history.

(56) References Cited

U.S. PATENT DOCUMENTS

| 6,518,588 | B1 | 2/2003 | Parkin et al. |
| 6,703,654 | B1 | 3/2004 | Horng et al. |
| 6,713,801 | B1 | 3/2004 | Sin et al. |
| 6,803,615 | B1 | 10/2004 | Sin et al. |
| 6,835,423 | B2 | 12/2004 | Chen et al. |
| 6,841,484 | B2 | 1/2005 | Ying et al. |
| 6,912,107 | B2 | 6/2005 | Chen et al. |
| 7,122,852 | B2 * | 10/2006 | Horng et al. ............... 257/295 |
| 7,208,807 | B2 | 4/2007 | Horng et al. |
| 7,211,447 | B2 | 5/2007 | Horng et al. |

OTHER PUBLICATIONS

"Nanoscale Diffusion Barriers for Copper Metallization" by Martin Traving et al., Semiconductor Int'l, Jul. 2003, 4 pgs.

* cited by examiner

*Primary Examiner*—Quoc Hoang
(74) *Attorney, Agent, or Firm*—Saile Ackerman LLC; Stephen B. Ackerman

(57) ABSTRACT

A method to fabricate an MTJ device and its connections to a CMOS integrated circuit is described. The device is built out of three layers. The bottom layer serves as a seed layer for the center layer, which is alpha tantalum, while the third, topmost, layer is selected for its smoothness, its compatibility with the inter-layer dielectric materials, and its ability to protect the underlying tantalum.

9 Claims, 1 Drawing Sheet

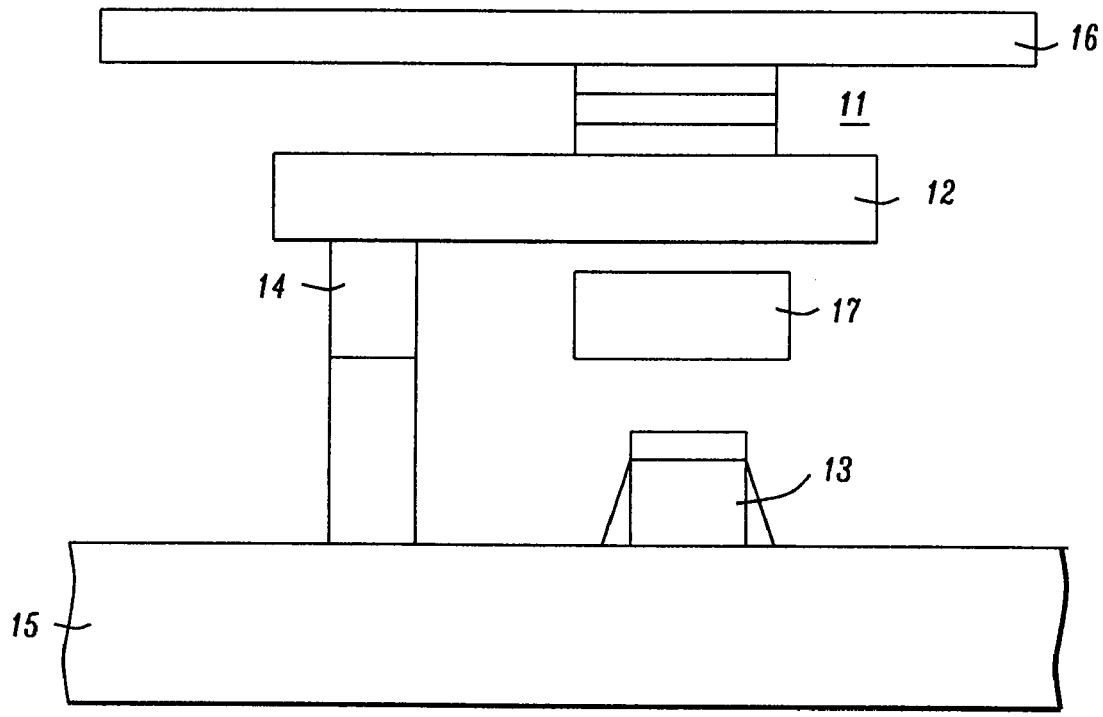
*FIG. 1 – Prior Art*
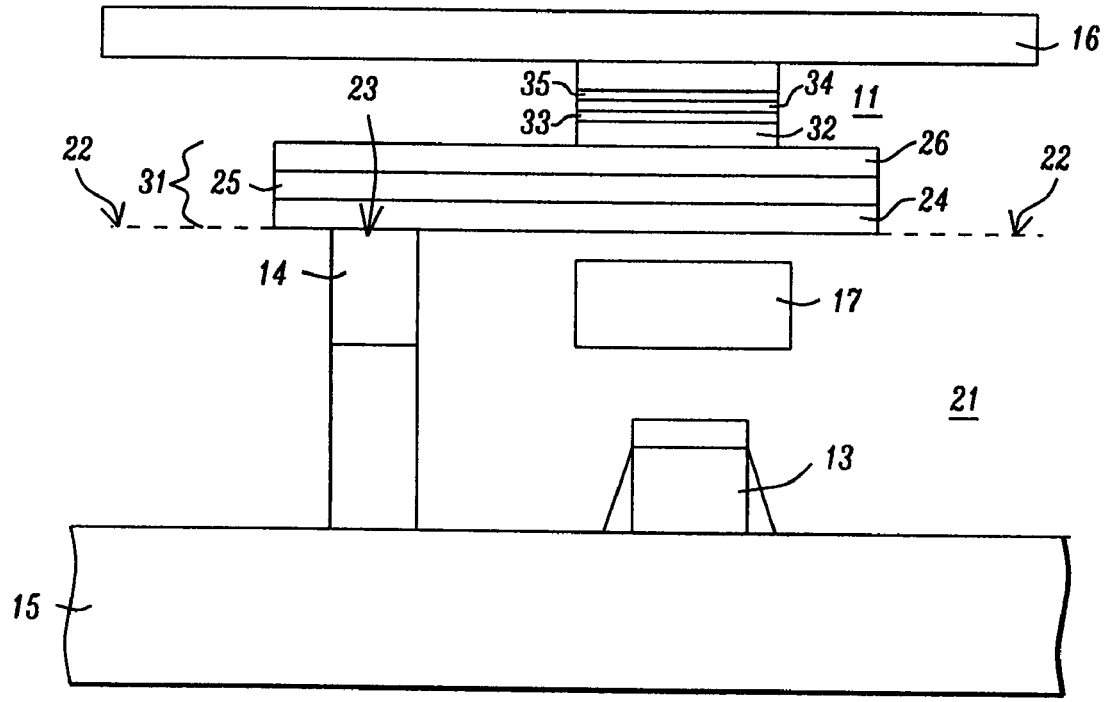
*FIG. 2*

BOTTOM CONDUCTOR FOR INTEGRATED MRAM

This is a divisional application of U.S. patent application Ser. No. 11/215,276, filed on Aug. 30, 2005, now U.S. Pat. No. 7,265,404 which is herein incorporated by reference in its entirety, and assigned to a common assignee. It is related to application Ser. No. 11/080,868, filed on Mar. 15, 2005 and to application Ser. No. 11/080,860, filed on Mar. 15, 2005 both of which are also herein incorporated, by reference, in their entirety.

FIELD OF THE INVENTION

The invention relates to the general field of magnetic memories with particular reference to the question of connecting them with other integrated circuitry.

BACKGROUND OF THE INVENTION

In MRAM (magnetic random access memory) array cells, information is stored in the free layer of an MTJ (magnetic tunnel junction) or GMR device (giant magneto-resistance). MTJ memory cells are often inserted into the back end of a CMOS process. As shown in FIG. 1, MTJ element 11 is formed on top of patterned bottom conductor lead 12, which is connected to one or more underlying transistors 13 by via 14 (conductive stud). Also seen in FIG. 1 are main silicon body 15, bit line 16, and word line 17.

Currently, bottom conductor lead films include NiCr/Ru100/Ta150/Ru30 (thicknesses in Angstroms), which we use, while other materials, such as Ta, Cr/Ta TaN/Ta have also been reported. In this bottom conductor structure, the Ta (capping) layer, which is formed on top of the Ru conductive layer, is grown as a low resistance phase. It is also noted that treating the low resistance Ta capping layer, prior to depositing the MTJ stack, is necessary for making a high performance MTJ (i.e. high DR/R, V50 (voltage at which dR/R is reduced by 50%) and low switching field Hc).

In the prior art, a TaN/Ta stack has been proposed as a bottom electrode by Parkin in U.S. Pat. No. 6,518,588. This bilayer bottom electrode has some potential issues for MRAM applications. In this patent, one possible bottom electrode structure is for TaN to be the main lateral body of the bottom electrode, which connects to a Cu stud (Ta has the same size as MTJ). TaN has very high resistivity, which in turn affects MRAM electrical performance.

Another possible bottom electrode structure in said patent is for the Ta layer to extend along the TaN layer. In this way, Ta will be the main component of the bottom electrode, providing a lower resistance path. But this Ta layer will be directly exposed to the top ILD (inter-layer dielectric) layer ($SiO_2$, F doped, or C-doped), making it susceptible to oxidation during the ILD process of it does not have a protective layer. This oxidized Ta will have higher resistance, causing bottom electrode performance to deteriorate. Also, it is well known that the interface between Ta and ILD $SiO_2$ is weak, causing significant problems with respect to process integration.

Thus, a major challenge for making a successful MRAM is how to integrate the bottom electrode of the MTJ stack with the standard CMOS back end of line (BEOL) process. To get better electrical performance, the bottom electrode must show low sheet resistance and low contact resistance with the underlying studs that connect the MTJ to the transistors.

To get lower resistance for the bottom electrode, the Ta film needs to be in the alpha crystalline phase. It has been shown that alpha Ta is obtained if deposited on a TaN layer (>10 $). As already noted, bilayer TaN/Ta as a bottom electrode is associated with some potential problems such as high resistance, easy oxidation, and poor adhesion to ILD layers. The present invention discloses a structure/method that overcomes these problems without sacrificing the advantages.

A routine search of the prior art was performed with the following references of interest being found:

In U.S. Pat. No. 6,518,588, Parkin et al. describe a TaN/Ta lead. U.S. Pat. No. 6,703,654 (Horng et al), assigned to a common assignee with the present invention, discloses a NiCr seed layer for the bottom electrode. U.S. Pat. No. 6,841,484 (Ping et al) discloses a Ta or TaN bottom electrode and, in U.S. Pat. No. 6,713,801, Sin et al. describe an alpha-Ta lead.

U.S. Pat. Nos. 6,912,107 and 6,835,423 (Chen et al.) describe a TaN diffusion barrier layer on a metal lead. U.S. Pat. No. 6,803,615 (Sin et al.) teaches that an AFM layer and an AFM seed layer may be formed over the bottom lead which may be W, Cu, or Al.

SUMMARY OF THE INVENTION

It has been an object of at least one embodiment of the present invention to provide an improved connector between a CMOS circuit and an MTJ.

Another object of at least one embodiment of the present invention has been that said improved connector not degrade, in any way, the performance of said MTJ.

Still another object of at least one embodiment of the present invention has been that said improved connector have good adhesion to all dielectric materials which it contacts.

A further object of at least one embodiment of the present invention has been to provide a method for forming said improved connector.

These objects have been achieved by building the connector out of three layers. The bottom layer serves as a seed layer for the center layer, which is alpha tantalum, while the third, topmost, layer is selected for its smoothness, its compatibility with the inter-layer dielectric materials, and its ability to protect the underlying tantalum. It is well suited to be the seed layer for the MTJ device that is built directly on it.

BRIEF DESCRIPTION OF THE DRAWINGS

FIG. 1 shows how an MTJ and a CMOS circuit are connected in the prior art.

FIG. 2 shows how an MTJ and a CMOS circuit are connected according to the teachings of the present invention.

DESCRIPTION OF THE PREFERRED EMBODIMENTS

We now provide a description of our method for forming an improved bottom lead structure that is suitable for MTJs in general but, more particularly, is fully compatible with connecting an MTJ to a nearby integrated circuit.

Referring now to FIG. 2, the method of the present invention begins with the provision of integrated circuit 21 having top surface 22 that includes exposed via 23. Seed layer 24, of a material on whose surface deposited tantalum will grow in its alpha crystalline phase, is then deposited on surface 22, including coverage of exposed via 23. Seed layer 24 is deposited to a thickness between about 10 and 20 Angstroms. Suitable materials for this seed layer include TaN, TiW, TiCr, and WN.

The next step is the deposition (to a thickness of between about 40 and 200 Angstroms) of layer of alpha tantalum 25 on seed layer 24. The alpha tantalum is deposited by a method such as PVD (physical vapor deposition) although other methods such as CVD (chemical vapor deposition) or ALD (atomic layer deposition) could also have been used.

Now follows an important step, namely the deposition of capping layer 26 on alpha tantalum layer 25. It is a key feature of the invention that layer 26 is required to have a surface roughness that is less than about 2.5 Angstroms. Capping layer 26 is deposited to a thickness of between about 10 and 50 Angstroms. Suitable materials for capping layer 26 include (but are not limited to) TaN. The capping layer needs to be amorphous in order to achieve the desired level of smoothness. Our preferred method for depositing the capping layer has been PVD but other methods such as CVD or ALD could also have been used.

The resulting three layer laminate 31 is now patterned (using standard photolithographic methods together with Reactive Ion Etching) so as to become a bottom electrode that contacts via 14 to a magnetic storage element which, in this case, is MTJ 11. The latter is formed by depositing antiferromagnetic layer 32 on bottom electrode 31 (more specifically, onto layer 26 followed by magnetically pinned layer 33. It is essential that layer 33 have a high degree of surface smoothness otherwise the performance and product yield of the entire MTJ structure will be impacted. This property of the pinned layer is directly dependent on the surface roughness of the bottom electrode, more particularly the surface roughness of layer 26.

Formation of the MTJ is completed by depositing dielectric tunneling layer 34 on the pinned layer followed by the deposition thereon of magnetically free layer 35.

When implemented as described above, the present invention achieves a lower resistivity film, better integration with the ILD, and overall cost savings since the film stack can be deposited in the same PVD (physical vapor deposition) chamber and RIE (reactive ion etching) can be performed in the same etch chamber used for the fabrication of the bottom conductor lead.

By using this sandwich structure, the bottom electrode with lower resistivity Ta film could successfully integrate with the ILD at both top and bottom, the ILD being either $SiO_2$, or SiNx here. Other advantages of the present invention include:

a) The TaN film chosen for capping has better adhesion to $SiO_2$, including USG (undoped silicate glass), FSG (fluorided silicate glass), and low k dielectrics. At the MTJ level, this will improve dielectric CMP performance. Additionally, the capping layer serves to protect Ta from oxidation.

b) Overall, the sandwich X/Ta/TaN structure can achieve lower resistance and better integration with dielectric materials ($Si_3N_4$ and $SiO_2$) for bottom electrode (where X represents the seed layer.

c) The capping film can also be used as the seed layer for the MTJ deposition.

What is claimed is:

1. A method to fabricate a magnetic tunnel junction, comprising:
    providing an integrated circuit having a top surface that includes an exposed via;
    depositing on said top surface, including said exposed via, a seed layer suitable for promoting growth of alpha phase tantalum;
    depositing a layer of alpha tantalum on said seed layer;
    depositing on said tantalum layer a capping layer having a surface roughness that is less than about 2.5 Angstroms, thereby forming a three layer laminate;
    patterning said laminate to form a bottom electrode that is in contact with said via; and
    then forming said magnetic tunnel junction on said bottom electrode.

2. The method recited in claim 1, further comprising;
    depositing an antiferromagnetic layer on said bottom electrode;
    on said antiferromagnetic layer, depositing a magnetically pinned layer whose surface roughness derives from that of said bottom electrode;
    depositing a dielectric tunneling layer on said pinned layer, and
    depositing a magnetically free layer on said dielectric tunneling layer, thereby forming said magnetic tunnel junction.

3. The method recited in claim 1 wherein said seed layer that is suitable for promoting growth of alpha phase tantalum is deposited to a thickness between about 10 and 20 Angstroms.

4. The method recited in claim 1 wherein said seed layer that is suitable for promoting growth of alpha phase tantalum is selected from the group consisting of TaN, TiW, TiCr, and WN.

5. The method recited in claim 1 wherein said layer of alpha tantalum is deposited to a thickness of between about 40 and 200 Angstroms.

6. The method recited in claim 1 wherein said layer of alpha tantalum is deposited by a method selected from the group consisting of PVD, CVD, and ALD.

7. The method recited in claim 1 wherein said capping layer is deposited to a thickness of between about 10 and 50 Angstroms.

8. The method recited in claim 1 wherein said capping layer is TaN.

9. The method recited in claim 1 wherein said capping layer is amorphous and is deposited by a method selected from the group consisting of PVD, CVD, and ALD.

* * * * *

UNITED STATES PATENT AND TRADEMARK OFFICE
CERTIFICATE OF CORRECTION

PATENT NO. : 7,358,100 B2  Page 1 of 1
APPLICATION NO. : 11/891923
DATED : April 15, 2008
INVENTOR(S) : Wei Cao et al.

It is certified that error appears in the above-identified patent and that said Letters Patent is hereby corrected as shown below:

Title Page
In the Assignee (73) delete "Magic Technologies, Inc." and replace with
--MagIC Technologies, Inc.--

Signed and Sealed this

Thirteenth Day of January, 2009

JON W. DUDAS
*Director of the United States Patent and Trademark Office*